United States Patent
Shimizu (10) Patent No.: US 7,035,149 B2
(45) Date of Patent: Apr. 25, 2006

(54) SEMICONDUCTOR MEMORY APPARATUS AND ACTIVATION SIGNAL GENERATION METHOD FOR SENSE AMPLIFIER

(75) Inventor: Hiroshi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/019,226

(22) Filed: Dec. 23, 2004

(65) Prior Publication Data
US 2006/0050569 A1   Mar. 9, 2006

(30) Foreign Application Priority Data
Sep. 6, 2004   (JP) .............................. 2004-258747

(51) Int. Cl.
*G11C 7/00*   (2006.01)
(52) U.S. Cl. ...................... 365/191; 365/205; 365/207; 365/210
(58) Field of Classification Search ...................... None
See application file for complete search history.

(56) References Cited

U.S. PATENT DOCUMENTS

| | | | | |
|---|---|---|---|---|
| 6,490,214 B1 * | 12/2002 | Kawasumi | .................. | 365/210 |
| 6,717,877 B1 | 4/2004 | Suzuki et al. | | |
| 2004/0095824 A1 * | 5/2004 | Kurumada et al. | ......... | 365/205 |
| 2005/0073885 A1 * | 4/2005 | Suzuki et al. | ............ | 365/185.2 |

FOREIGN PATENT DOCUMENTS

JP   2002-216481   8/2002

\* cited by examiner

*Primary Examiner*—Tan T. Nguyen
(74) *Attorney, Agent, or Firm*—Arent Fox PLLC (57) ABSTRACT

A semiconductor memory apparatus, comprising a cell array comprising a plurality of memory cells; a sense amplifier; and a self-timing unit comprising a plurality of dummy bit-lines, selecting the dummy bit-line based on the position of the memory cell of which a data is read out, and generating an activation signal for controlling an activation timing of a sense amplifier at a time of reading data.

13 Claims, 9 Drawing Sheets

SEMICONDUCTOR MEMORY APPARATUS AND ACTIVATION SIGNAL GENERATION METHOD FOR SENSE AMPLIFIER

CROSS-REFERENCE TO RELATED APPLICATIONS

This application is based upon and claims the benefit of priority from the prior Japanese Patent Application No. 2004-258747, filed in Sep. 6, 2004, the entire contents of which are incorporated herein by reference.

BACKGROUND OF THE INVENTION

1. Field of the Invention

The present invention relates to a semiconductor memory apparatus and in particular to a semiconductor memory apparatus comprising a timing control circuit simulating a signal delay.

2. Description of the Related Art

In a semiconductor memory apparatus, an activation timing for a sense amplifier amplifying a data read out of a memory cell is designed to occur after a voltage difference between a bit-line pair becomes amply apart.

An activation signal controlling the activation timing for a sense amplifier is preferable to be generated at the shortest timing after a predefined voltage is generated between a bit-line pair, thereby shortening an access time.

However, while the capability of driving the bit-line of a memory cell depends on the electrical characteristics of transistors therein which vary in the manufacturing process thereof, therefore the activation signal generation needs to have an ample timing margin. And the timing margin causes a problem of an access time to a memory becoming longer.

A method for solving the problem is to equip a dummy circuit made up of a word-line, memory cells and a bit-line, and to generate an activating signal for a sense amplifier by utilizing a self-timing circuit which simulates a signal delay within a semiconductor memory apparatus by using the dummy circuit.

Figure 1:
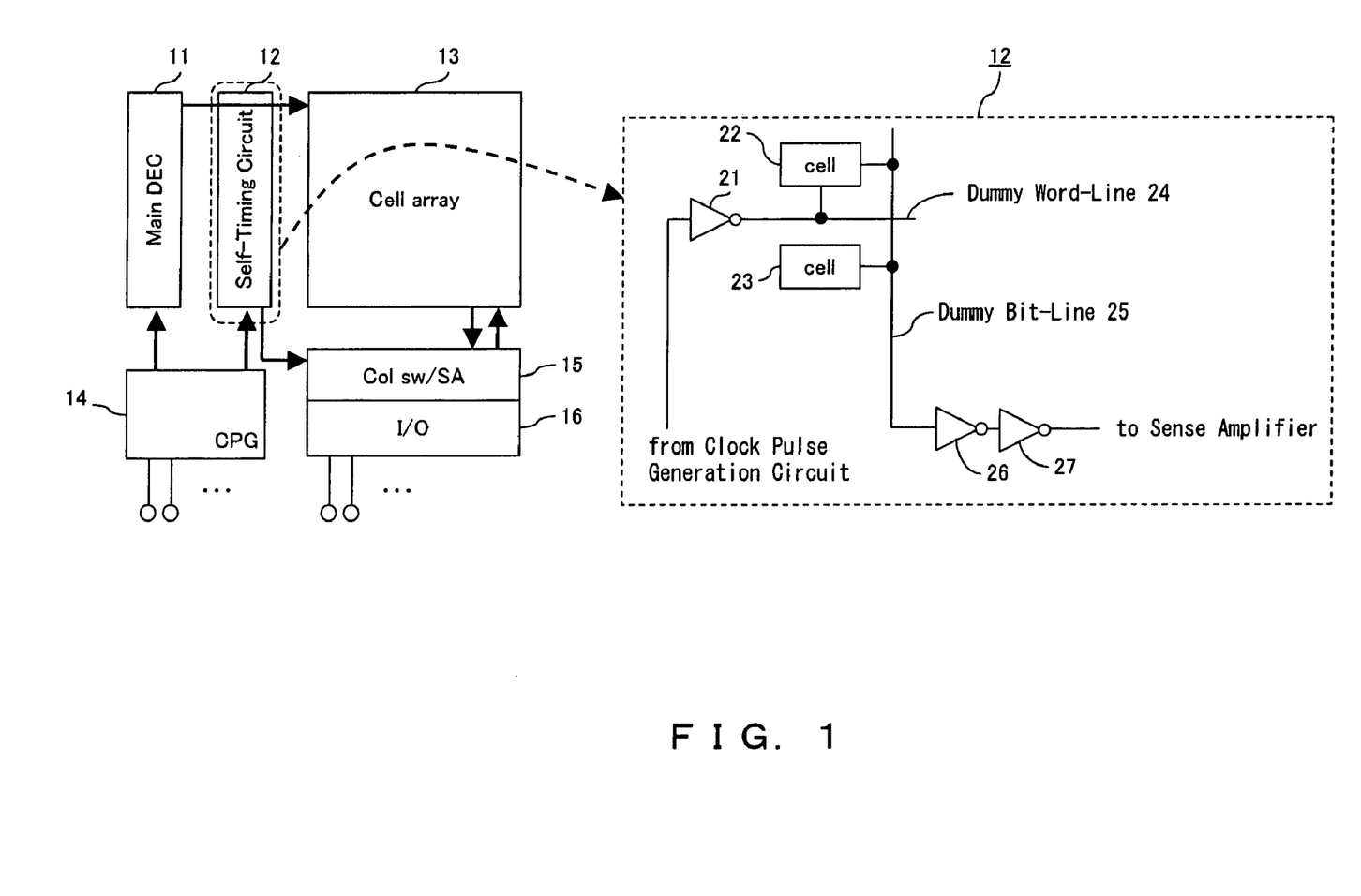
FIG. 1 illustrates a comprisal of a semiconductor memory apparatus having a configuration for a common self-timing.

FIG. 1 illustrates a summary framework of a semiconductor memory apparatus having a setup for a self-timing. FIG. 1 shows only a part thereof related to a data read-out.

In FIG. 1, a semiconductor memory apparatus comprises a main decoder 11 decoding an externally supplied address signal, generating a word-line selection signal and selecting one memory cell from among a cell array 13; a self-timing circuit 12 generating timing control signals such as a sense amplifier starting signal; a cell array 13 comprising a plurality of memory cells; a clock pulse generation circuit 14 generating a base clock signal and a column selection signal by decoding an address selection signal; a column switch and sense amplifier 15 including a column switch for selecting a bit-line of a memory array by a column selection signal from the clock pulse generation circuit 14 and a sense amplifier for amplifying an output from the column switch; and an input-output circuit 16 outputting a read-out output from the sense amplifier to the outside as a data.

The self-timing circuit 12 generates an activation signal for controlling activation timing for the sense amplifier from a clock signal inputted by the clock pulse generation circuit 14, and inputs the signal to the sense amplifier 15.

The self-timing circuit 12 comprises a dummy word line 24, and a dummy bit-line 25 comprising a charge extraction dummy cell 22 and a load dummy cell 23. And, when the dummy word-line 24 is driven by a signal which is a clock signal outputted from the clock pulse generation circuit 14 and then amplified by an inverter 21 so that the charge extraction dummy cell 22 is selected, then the dummy bit line 25 is driven. The signal on the dummy bit line 25 is then amplified by the buffers 26 and 27, and thereby an activation signal is generated for controlling timing of the sense amplifier activation.

Meanwhile, as a method for generating an activation signal for a sense amplifier by using a dummy cell as described above, known is a configuration which comprises a plurality of bit-lines having a different number of dummy cells and adjusts a delay time length by selecting one of the aforementioned dummy bit-lines as a pre-adjustment, as presented by the patent document 1 (i.e., a Japanese patent laid-open application publication 2002-216481; FIG. 4 and paragraphs 0019 to 0020).

Since a memory array is large in physical size, a distance from a memory cell to the sense amplifier varies in great deal depending on the location of a memory cell in a memory array, and accordingly a magnitude of the signal delay. Therefore a semiconductor memory apparatus equipped with a common self-timing circuit having only one dummy bit-line (i.e., a pair thereof) is not capable of precisely simulating the signal delays for the memory cells in all the locations.

Also in a configuration having a plurality of dummy bit-lines as presented by the patent document 1 noted above, et cetera, switching a dummy bit-line is set up as a transmission gate, not a column switch used in the normal path for reading data out of non-dummy cells. This makes the magnitude of signal delay through the dummy bit-line path in the simulation different from the actual path for reading data out of a memory cell.

Furthermore, in the configuration as presented by the patent document 1 above, et cetera, a plurality of dummy bit-lines are subjected to switching which is not done dynamically during the normal operation reading data out of the semiconductor memory apparatus, but is done by a method such as using an input value from an external terminal for setting a state, or cutting off a fuse, in order to go through an adjustment after the initial evaluation. Therefore, it is not possible to switch dynamically a dummy bit-line to be used. On the contrary, for example, it is required to set a larger delay for reading data out of a memory cell in longer distance from the column switch while a smaller delay for reading out thereof in shorter distance therefrom, thus precluding a dynamic switching of a plurality of dummy bit-lines in actual operations.

SUMMARY OF THE INVENTION

The challenge of the present invention is to provide a semiconductor memory apparatus and a generation method for an activation signal of a sense amplifier which solve the problems described above.

In order to solve the problems described above, an apparatus designed in accordance with the present invention comprises a cell array comprising a plurality of memory cells, a sense amplifier and a self-timing unit.

The self-timing unit comprises a plurality of dummy bit-lines, selects the dummy bit-line based on the position of a memory cell of which a data is read out, and generates an activation signal for controlling an activation timing of the sense amplifier at a time of data reading.

This enables a dynamic selection of the dummy bit-line based on the position of a data read-out memory cell.

The self-timing unit may also be configured so as to select the dummy bit-line based on the distance between the data read-out memory cell and the sense amplifier.

This enables a magnitude of delay of activation signal for controlling an activation timing of the sense amplifier to be adjusted based on the distance between the data read-out memory cell and the sense amplifier.

The magnitude of delay of activation signal may be adjusted by a configuration in which each of the plurality of dummy bit-lines is connected with the respectively different number of charge extraction dummy cells; and the self-timing unit selects one dummy bit-line connected with a small number of the charge extraction dummy cell when the distance between the data read-out memory cell and the sense amplifier is long, while selects one dummy bit-line connected with a large number of the charge extraction dummy cells when the distance between the data read-out memory cell and the sense amplifier is short.

It may also be adjusted by a configuration in which each of the plurality of dummy bit-lines is connected with the same number of charge extraction dummy cell; and the self-timing unit changes the number of the dummy bit-lines to be selected based on the position of the data read-out memory cell.

It may alternatively be adjusted by a configuration in which each of the plurality of dummy bit-lines is connected with the respectively different numbers of charge extraction dummy cell; and the self-timing unit selects one or a plurality from among the plurality of dummy bit-lines based on a location of where the data is read out of.

The self-timing unit may also be configured so as to comprise a selection unit selecting the dummy bit-line based on a decoder signal used for selecting a word-line.

This configuration does not require a specific logic circuit for selecting the dummy bit-line.

The self-timing unit may alternatively be configured so as to comprise a switch selecting the dummy bit-line which is the same as a column switch used for the path for reading data out of the memory cell in the layout level.

The self-timing unit may also be configured so as to comprise an amplifier amplifying a signal on the selected dummy bit-line, that is the same as the sense amplifier in the layout level.

These configurations enable the electrical characteristics of the dummy parts for simulating a delay to be closer to that of the path for actually reading data out of the memory cells.

Additionally, the scope of the present invention comprehends a generation method for an activation signal controlling an activation timing of the sense amplifier amplifying a read-out signal out of a memory cell in a semiconductor memory apparatus.

According to the present invention, a delay of activation signal is dynamically changed based on the position of data read-out memory cell, thereby enabling an activation of the sense amplifier at the best timing. Also, by making the configuration of the elements used for the path simulating a delay the same as those of the elements used for the actual path for reading data out of the memory cells in the layout level, it is possible to simulate the delay more precisely and generate activation signals having more suitable timing.

DESCRIPTION OF THE PREFERRED EMBODIMENTS

The embodiment of the present invention is described in reference to the accompanying drawings as follows.

Figure 2:
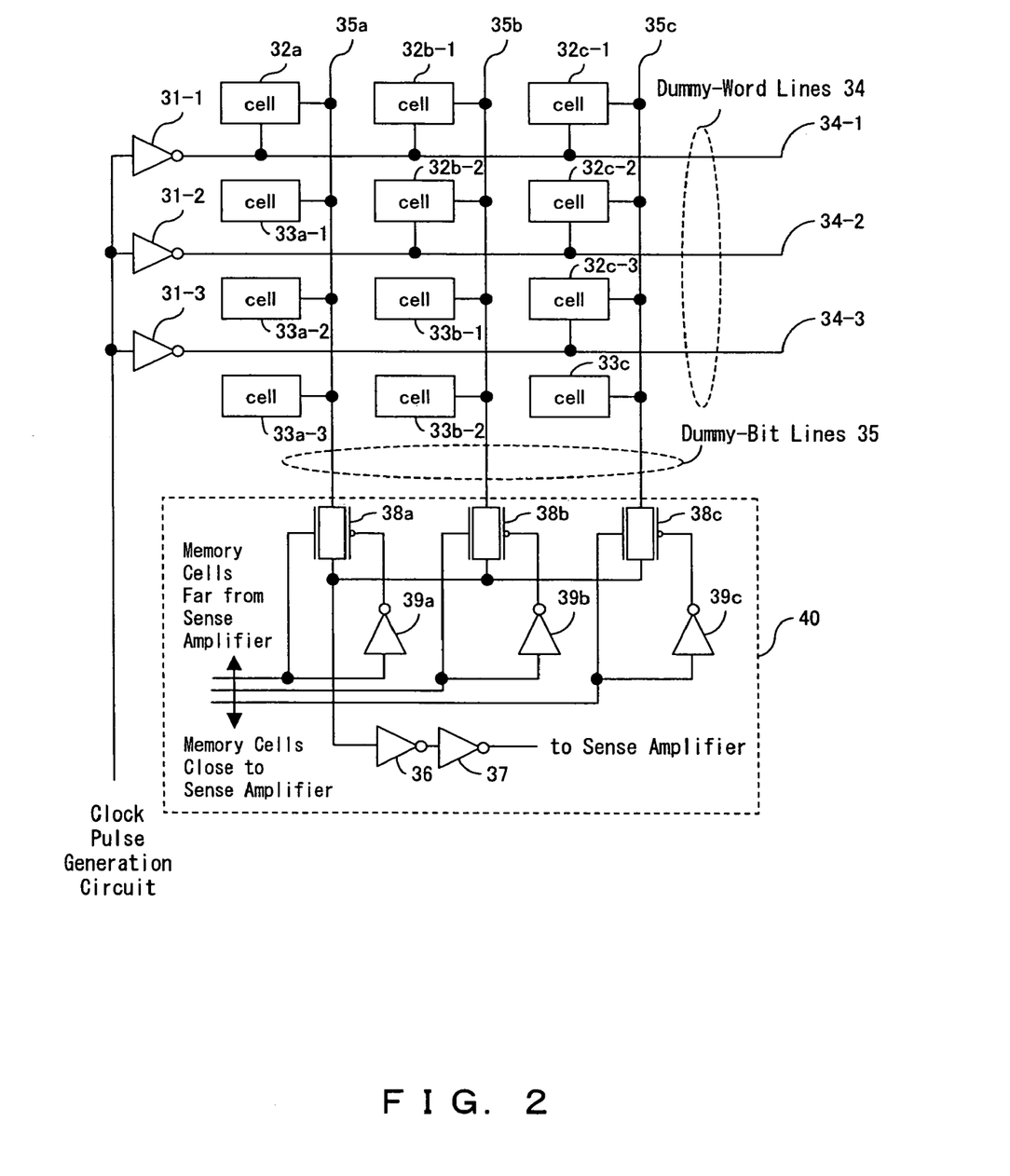
FIG. 2 shows an example configuration of a first embodiment of a self-timing circuit for a semiconductor memory apparatus according to the present embodiment.

FIG. 2 shows an example configuration of a first embodiment of a self-timing circuit for a semiconductor memory apparatus according to the present embodiment.

Note that the semiconductor memory apparatus according to the present embodiment comprises, just as a semiconductor memory apparatus having the configuration of common self-timing as shown in FIG. 1, a main decoder decoding an externally supplied address signal, generating a word-line selection signal and selecting one memory cell from among a cell array; a self-timing circuit generating timing control signals such as a sense amplifier starting signal; a cell array comprising a plurality of memory cells; a clock pulse generation circuit generating a base clock signal and a column selection signal by decoding a selection signal; a column switch and sense amplifier including a column switch for selecting a bit-line of a memory array by a column selection signal from the clock pulse generation circuit and sense amplifier for amplifying an output from the column switch; and an input-output circuit outputting a read-out output from the sense amplifier to the outside as a data.

The internal configuration and operation of each of these components are also the same as those of a common semiconductor memory apparatus, except for the parts described hereinafter.

A self-timing circuit for the semiconductor memory apparatus according to the present embodiment comprises a plurality of dummy bit-lines 35, and each of the dummy bit-lines comprises the respectively different numbers of charge extraction dummy cells 32 which are also connected respectively with the dummy word-line 34.

In FIG. 2, the self-timing circuit comprises three dummy bit-lines 35 consisting of dummy bit-lines 35a, 35b and 35c, each of which is connected with the respectively different numbers of the charge extraction dummy cell 32 and of the load dummy cells 33 which are not connected with the dummy word-lines 34. The dummy bit-line 35a is connected with one charge extraction dummy cell 32a, the dummy bit-line 35b is connected with two charge extraction dummy cells 32b-1 and 32b-2, and the dummy bit-line 35c is connected with three charge extraction dummy cells 32c-1, 32c-2 and 32c-3. Each of the dummy bit-lines 35a, 35b and 35c is therefore connected with the same number of dummy cells as the total of the charge extraction dummy cell 32 and the load dummy cell 33.

Also in FIG. 2, although each of the dummy bit-lines 35a, 35b and 35c is connected with four dummy cells, respectively, each dummy bit-line 35 is, for simplicity, for example, connected with the number of dummy cells as the total of the charge extraction dummy cell 32 and the load dummy cell 33 being the same number of memory cells connected with the bit-lines in a cell array. The ratio of the charge extraction dummy cell to the load dummy cell is not limited as above.

Each of the dummy bit-lines 35a, 35b and 35c is equipped with one of the column switches 38a, 38b and 38c, respectively, and one of the inverters 39a, 39b and 39c, respectively, so that a decoding signal from the clock pulse generation circuit is inputted to each of the dummy word-lines 34 by way of the inverter 31 at the time of a data read-out, and at the same time, the column switches 38a, 38b and 38c select a suitable dummy bit-line 35 and connect it to the inverters 36 and 37.

Each of the dummy bit-lines 35a, 35b and 35c is connected with the respectively different numbers of the charge extraction dummy cell 32 and therefore the magnitude of delay is different from others. In this embodiment, a dummy bit-line connected with a smaller number of the charge extraction dummy cell 32, i.e., a larger magnitude of delay, is selected for a memory cell located in a longer distance from the sense amplifier, whereas a dummy bit-line connected with a larger number of the charge extraction dummy cell 32, i.e., a smaller magnitude of delay, is selected for a memory cell located in a shorter distance from the sense amplifier. For example, in the self-timing circuit shown by FIG. 2, the dummy bit-line 35a is selected for reading data out of a memory cell located in the longest distance from the sense amplifier, whereas the dummy bit-line 35c is selected for reading data out of a memory cell located in the shortest distance from the sense amplifier, thereby generating and outputting an activation signal.

This enables the generation of an appropriate activation signal of the sense amplifier unaffected by a memory cell location in the memory chip.

Meanwhile, in the self-timing circuit of the semiconductor memory apparatus according to the present embodiment, a configuration of the column switches 38 selecting a dummy bit-line 35 is the same as that of the column switches used for the actual circuit used for reading data out of memory cells in a cell array, and the same circuitry is used for the amplifier circuit receiving the output of the column switch 38 as that of the sense amplifier.

Figure 3:
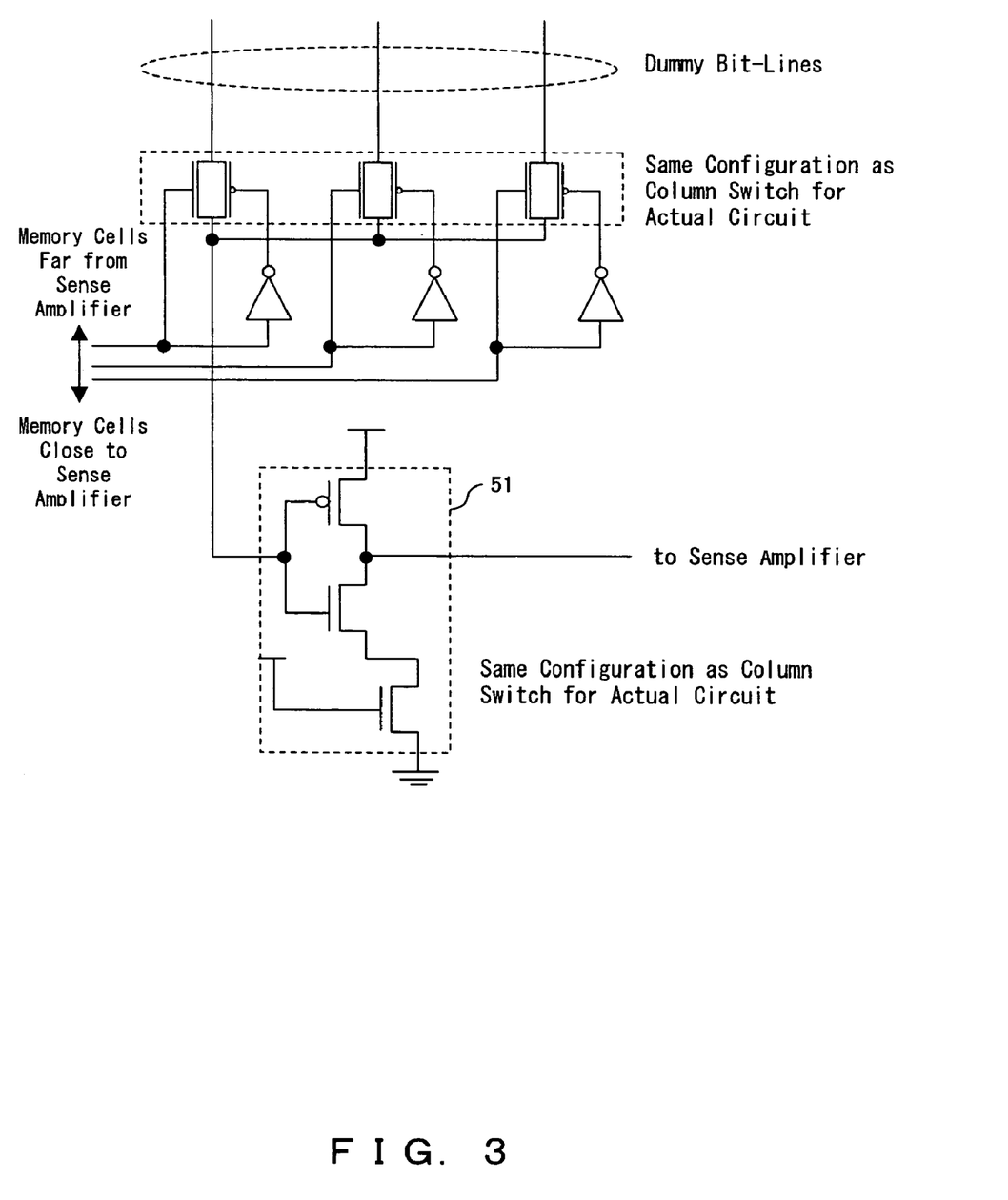
FIG. 3 shows a part selecting an output of dummy bit-lines.

FIG. 3 shows the part of the dotted area 40 indicated in FIG. 2, selecting and outputting a dummy bit-line.

In FIG. 2, three column switches 35a, 35b and 35c selecting a dummy bit-line and connecting it with the sense amplifier 51 are made the same as the column switches connected with the data memorizing memory cells, not the dummy cells, in the layout level such as the transistor configuration or the size thereof.

Also the amplifier 51 (which corresponds to a combination between the inverters 36 and 37 shown in FIG. 2) amplifying an output of the column switch 35 is made the same as the sense amplifier in the layout level.

The above configuration makes the electrical characteristics of the dummy part simulating a delay closer to that of the actual part of the circuit reading data out of the memory cell.

Incidentally, making the column switches and the amplifier receiving an output from the column switch the same as the ones used for reading data out of a memory cell in the layout level, as shown in FIG. 3, may be applied not only to the first embodiment described above but also to a second and third embodiments which are described later.

The proposed methods for selecting the dummy bit-lines are then described as follows.

Figure 4:
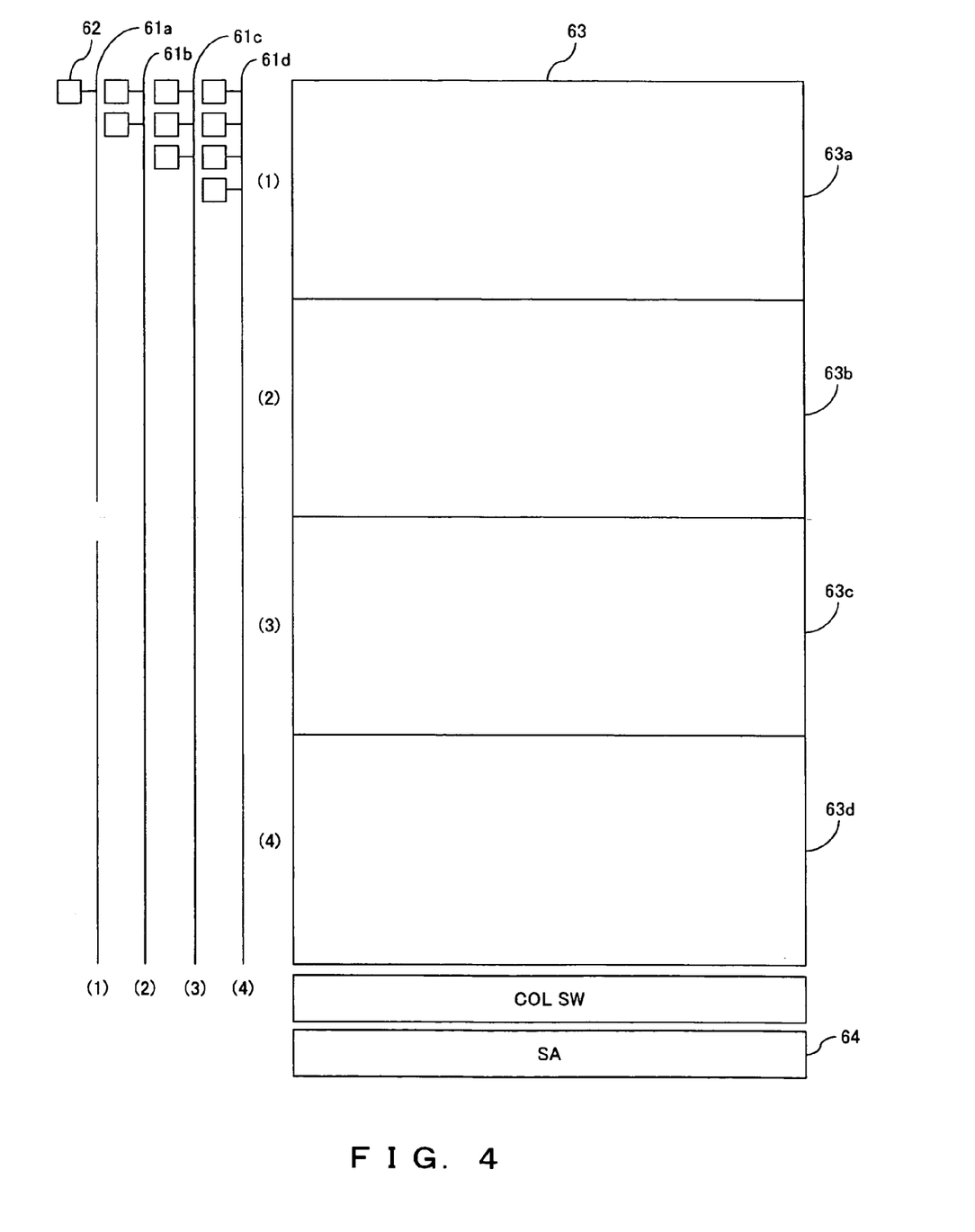
FIG. 4 shows a method by which a dummy bit-line is selected according to the present embodiment.

FIG. 4 shows a method by which the dummy bit-lines are selected according to the present embodiment.

In this embodiment, a dummy bit-line to be used is changed corresponding to the location of a memory cell to be read data out of.

If a memory cell is located in a longer distance from the sense amplifier, a delay in signal transmission is greater by that much, and therefore an activation signal controlling the activation timing of the sense amplifier will be delayed accordingly.

With a decreased number of the charge extraction dummy cells connected to a dummy bit-line and an increased number of the load dummy cells by that much connected to the dummy bit-line, a load on the dummy bit-line increases in proportion to the number of the load dummy cells, thereby delaying a signal read-out. Contrarily, with an increased number of the charge extraction dummy cells connected to a dummy bit-line and a decreased number of the load dummy cells by that much connected to the dummy bit-line, a load on the dummy bit-line decreases in proportion to the number of the load dummy cells, thereby advancing a signal read-out.

Hence in FIG. 4, the dummy bit-line 61a connected with the smallest number of the charge extraction dummy cells 61 and the largest number of the load dummy cells among the four dummy bit-lines 61a, 61b, 61c and 61d is selected for reading data out of the memory cells in the block 63a of the cell array 63 located in the longest distance from the sense amplifier 64, and as the locations 63b, 63c and 63d, in this order, become shorter distances from the sense amplifier 64, one of the dummy bit-lines 61b, 61c and 61d, in this order, connected with a larger number of the charge extraction dummy cells 61 (and a smaller number of the load dummy cells), and hence with less magnitude of the delay, is selected respectively.

Among a various concepts of mechanisms for selecting the dummy bit-lines, an example contrivance is considered of using a decoder signal from the main decoder.

Figure 5:
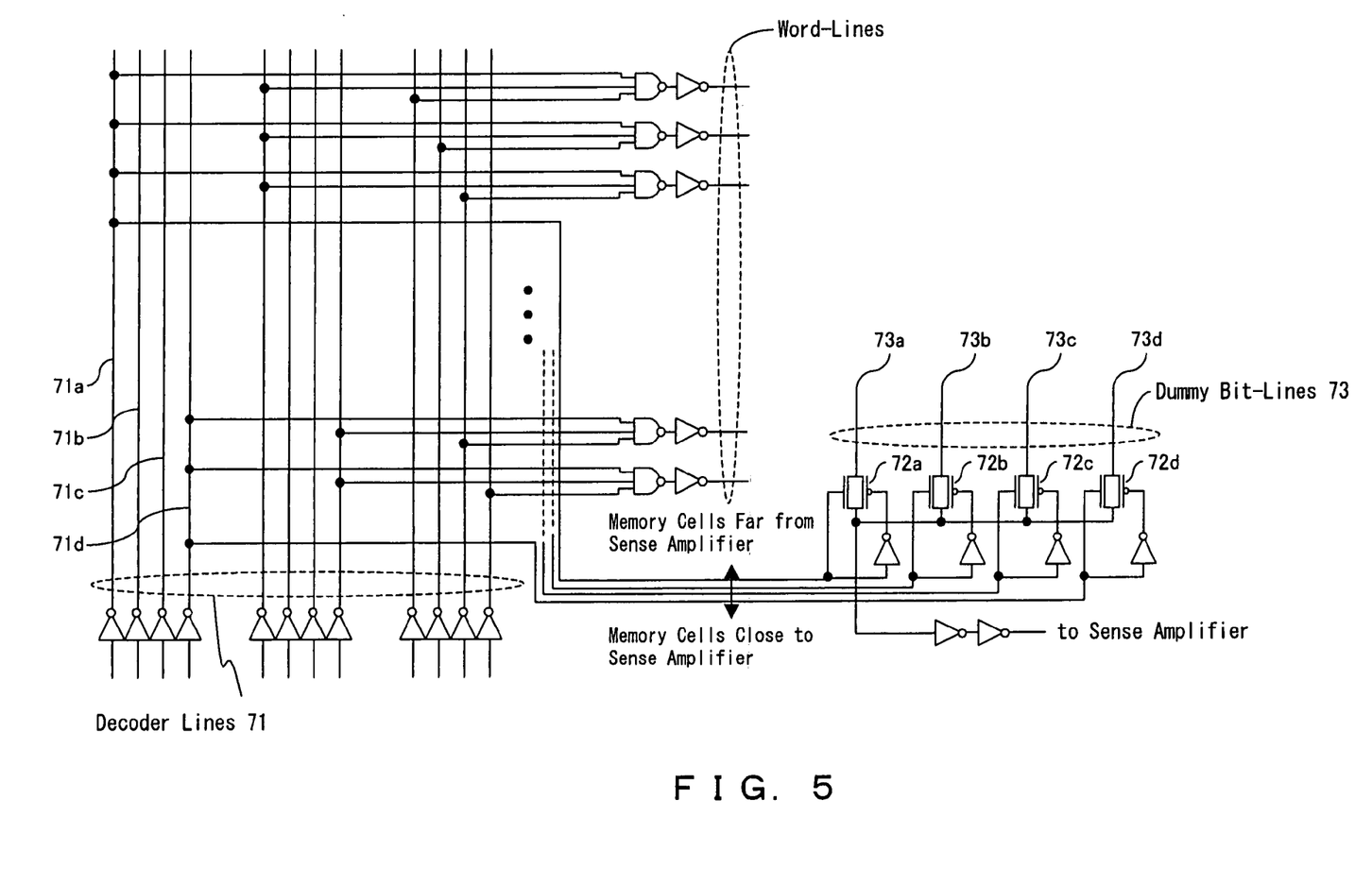
FIG. 5 shows a configuration for selecting a dummy bit-line by using a decoder signal.

FIG. 5 shows a configuration for selecting a dummy bit-line by using a decoder signal.

In FIG. 5, one of the four dummy bit-lines is selected by switching the column switches connected with the dummy bit-lines by using decoder signals on the decoder lines generated by the main decoder and used for selecting word-lines.

FIG. 5 shows a configuration of the case in which word-lines in the cell array are selected by using twelve decoder lines 71, with the highest-order decoder line 71a selecting the farthest eight word-lines and the next-order decoder line 71b selecting the next farthest eight word-lines, and hence a column switch is selected by these decoder line signals. In this case, a decoder signal on the highest-order decoder line 71a selecting the word-lines connected with the memory cells located in the farthest distance is used as the selection signal for switching the column switch 72a on the dummy bit-line 73a connected with the largest number of the load dummy cells and hence having the largest delay, a decoder signal on the next-order decoder line 71b is used as the selection signal for switching the column switch 72b on the dummy bit-line 73*b*, a decoder signal on the next-order decoder line 71*c* is used as the selection signal for switching the column switch 72*c* on the dummy bit-line 73*c*, and a decoder signal on the decoder line 71*d* selecting the word-lines connected with the memory cells located in the shortest distance is used as the selection signal for switching the column switch 72*d* on the dummy bit-line 73*d*.

Such a configuration does not require a specific logic circuit for controlling switching of the column switches and generating a selection signal selecting a dummy bit-line.

An alternative configuration may be such that a separate selection circuit is comprised for selecting a dummy bit-line, thereby switching the dummy bit-lines as shown by FIG. 4.

Figure 6:
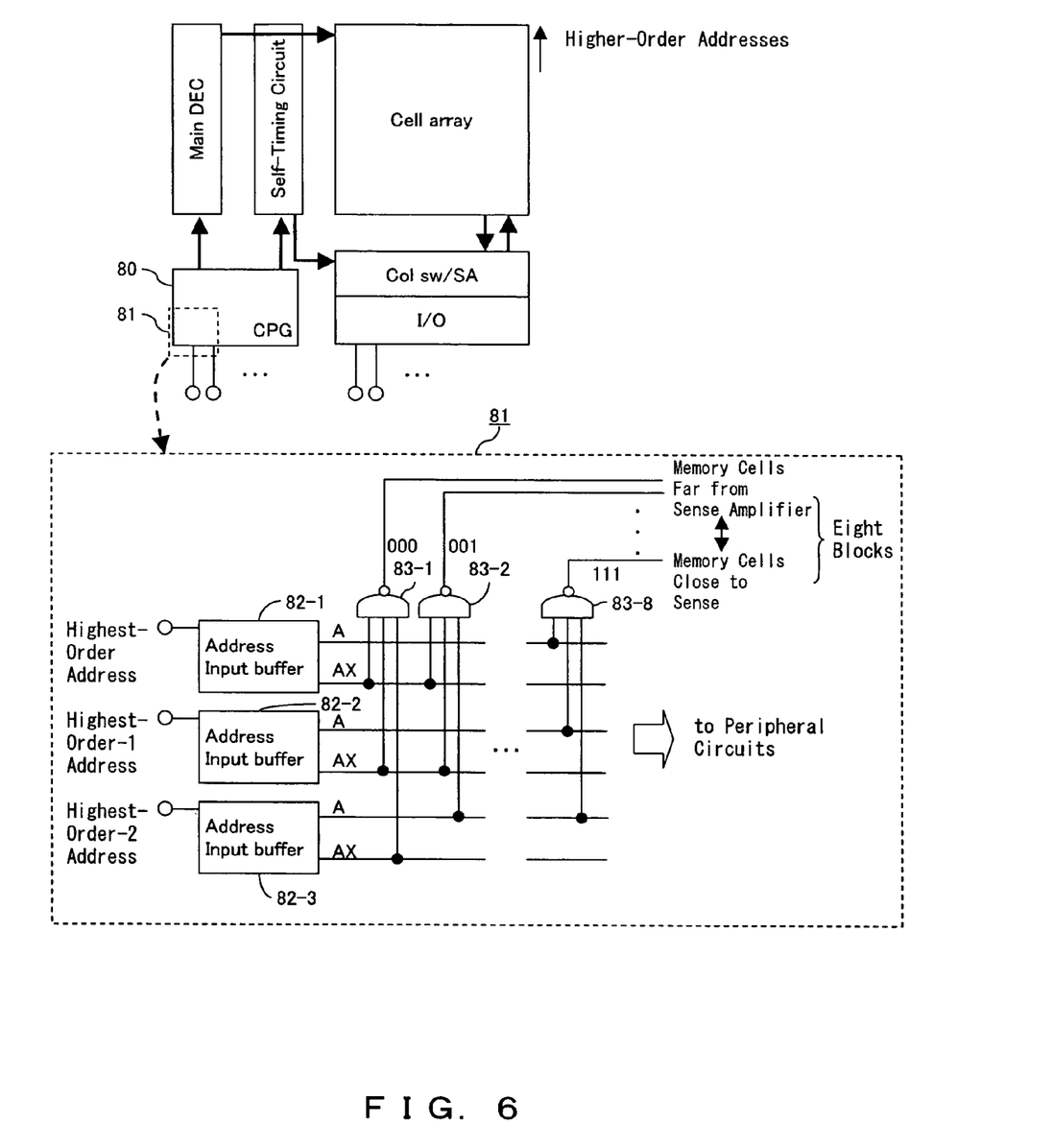
FIG. 6 shows a circuitry of a selection circuit.
Figure 7:
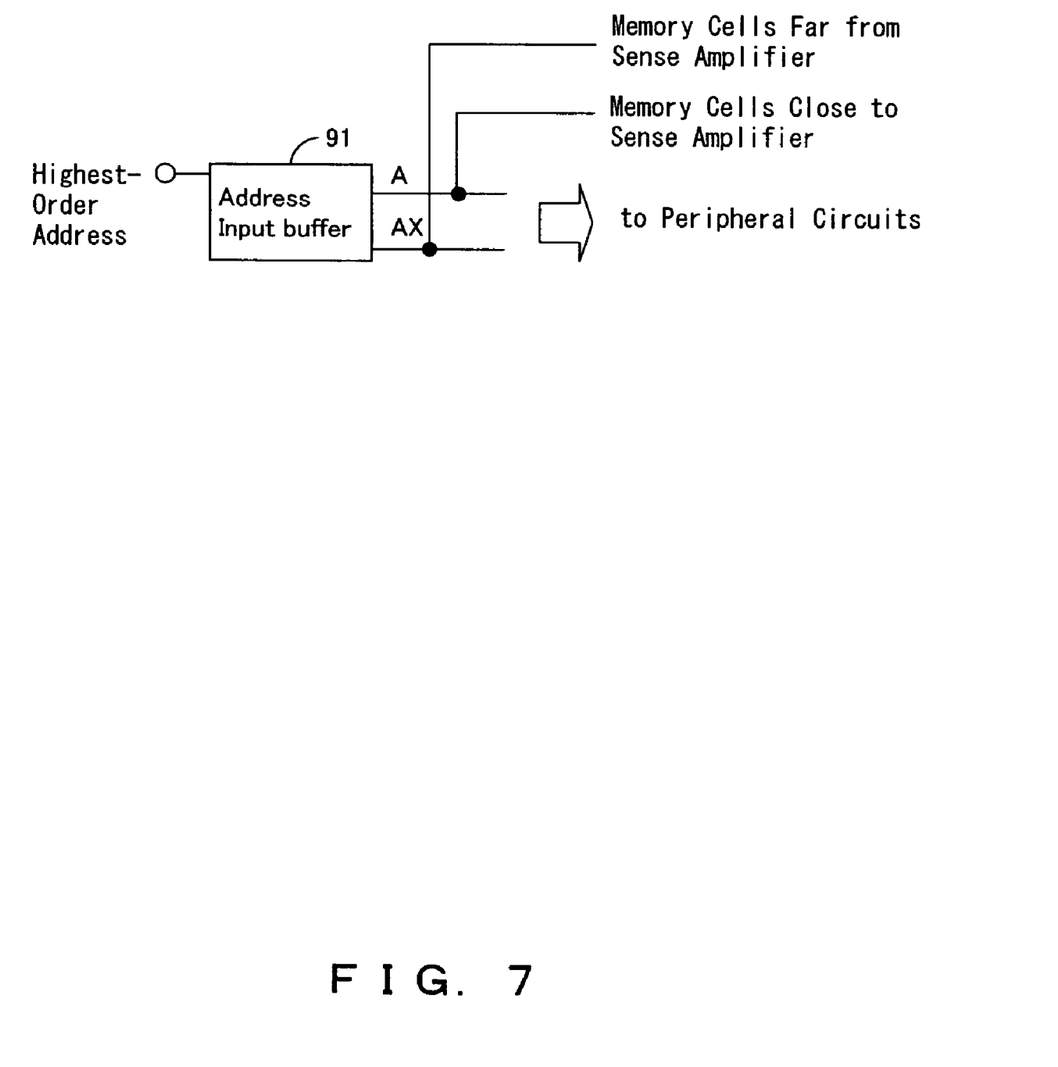
FIG. 7 shows another circuitry of a selection circuit.

FIGS. 6 and 7 show circuitries of such selection circuits.

The selection circuit shown by FIG. 6 or 7 is equipped in a clock pulse generator 80 and generates a selection signal for the dummy bit-lines by using an address signal from outside of the semiconductor memory apparatus.

The selection circuit shown by FIG. 6 is an example configuration of the construction of cell array being such that, as the address value increases, the memory cell is located in a longer distance from the sense amplifier, and eight dummy bit-lines are switched -on and -off by using signals on the highest-order three address lines.

The selection circuit shown by FIG. 6 comprises input buffers 82-1, 82-2 and 82-3 buffering the highest-order address signal value, the second highest-order address signal value and the next-order address signal value and outputting a positive or negative value; and generates selection signals for switching the column switches on the dummy bit-lines through a NAND circuit 83 by using the positive or negative value from the aforementioned input buffers.

And, when the highest three bits of the address are "000," a data is read out of a memory cell located in the block located in the shortest distance from the sense amplifier and therefore a dummy bit-line having the smallest delay is selected. Alternatively, when the highest three bits of the address are "001," "010," et cetera, addressing the read-out memory cells located in longer distances from the sense amplifier, then selection signals for selecting the dummy bit-lines having respectively greater magnitudes of the delay are generated from the positive or negative signals outputted from each of the input buffers 82-1, 82-2 and 82-3, and when the highest three bits of the address are "111," then a selection signal for selecting a dummy bit-line having the greatest magnitude of delay is generated by the NAND circuit 83-8.

Then the column switches on the dummy bit-lines are switched -on and -off based on the selection signal, and an activation signal for controlling the activation timing for the sense amplifier is generated by a signal from the selected dummy bit-line and outputted to the sense amplifier.

Meanwhile, FIG. 7 shows a circuitry of a selection circuit generating a selection signal selecting one of the two dummy bit-lines by using only the address lines of the highest-order address.

The selection circuit shown by FIG. 7 is equipped in the clock pulse generator 80 and generates a selection signal for the dummy bit-lines by using an address signal from the outside of the semiconductor memory apparatus, the same as the selection circuit shown by FIG. 6.

The selection circuit shown by FIG. 7 comprises an address input buffer 91 buffering the highest-order address signal and outputting the positive and negative values, with the positive logic output of the address input buffer 91 becoming "High" when the highest-order address of the read-out memory cell is "1," and with the negative logic output of the address input buffer 91 becoming "High" when the highest-order address of the read-out memory cell is "0." Therefore, it is possible to make an appropriate selection by connecting the column switch with the positive logic output of the address input buffer 91 as the selection signal for selecting a dummy bit-line having a greater magnitude of delay, and with the negative logic output of thereof as the selection signal for selecting a dummy bit-line having a smaller magnitude of delay.

A self-timing circuit according to a second embodiment is then described as follows. Note that the method for generating a signal to be inputted into the column switches selecting a dummy bit-line in the self-timing circuit according to the second and a third embodiments is either by using a signal on the decoder signal line for a selection signal, or by equipping a selection circuit generating a selection signal based on an address signal, all of which have been shown by FIGS. 5, 6 and 7.

Figure 8:
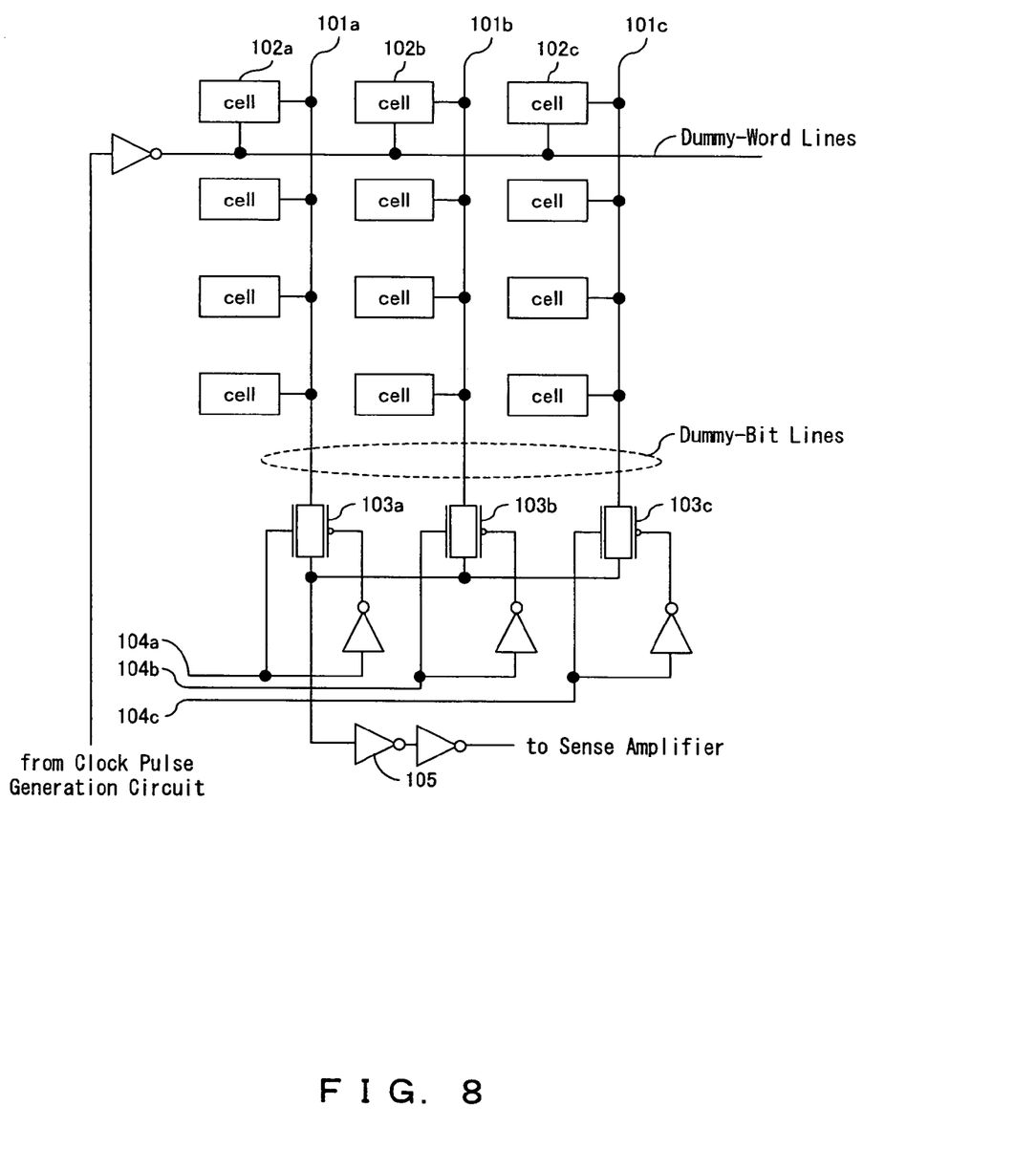
FIG. 8 shows an example configuration of a second embodiment of a self-timing circuit for a semiconductor memory apparatus according to the present embodiment.

FIG. 8 shows an example configuration of a second embodiment of a self-timing circuit for a semiconductor memory apparatus according to the present embodiment.

The self-timing circuit of the second embodiment comprises a plurality of dummy bit-lines each of which is connected by one equal number of charge extraction dummy cells and by another equal number of load dummy cells.

And, in selecting one or a plurality of dummy bit-lines, one dummy bit-line is selected to connect for reading data out of a memory cell located in a long distance from the sense amplifier, hence requiring a greater magnitude of delay, while a plurality of the dummy bit-lines are selected to connect for reading data out of a memory cell located in shorter distances from the sense amplifier, hence requiring a smaller magnitude of delay.

In the configuration shown by FIG. 8, each of the dummy bit-lines 101*a*, 101*b*, 101*c* and 101*d* is respectively connected by a charge extraction dummy cell 102. And, only the column switch 103*a* is turned on by the selection signal line 104*a* and only the dummy bit-line 101*a* is connected to the buffer 105 for reading data out of a memory cell located in a long distance from the sense amplifier. Comparatively, the column switches 103*a*, 103*b* and 103*c* are all turned on by the selection signal lines 104*a*, 104*b* and 104*c* and the dummy bit-lines 101*a*, 101*b* and 101*c* are all connected to the buffer 105 for reading data out of a memory cell located in a short distance from the sense amplifier. Meanwhile, the column switches 103*a* and 103*b* are turned on by the selection signal lines 104*a* and 104*b* and the dummy bit-lines 101*a* and 101*b* are connected to the buffer 105 for reading data out of a memory cell located in a middle distance from the sense amplifier.

As such, in the self-timing circuit of the second embodiment, the number of the selected dummy bit-lines is increased with the magnitude of the required delay, thereby enabling a precise simulation of signal delay and generation of activation signal controlling an appropriate activation timing for the sense amplifier as in the self-timing circuit of the first embodiment.

A self-timing circuit according to a third embodiment is then described as follows.

Figure 9:
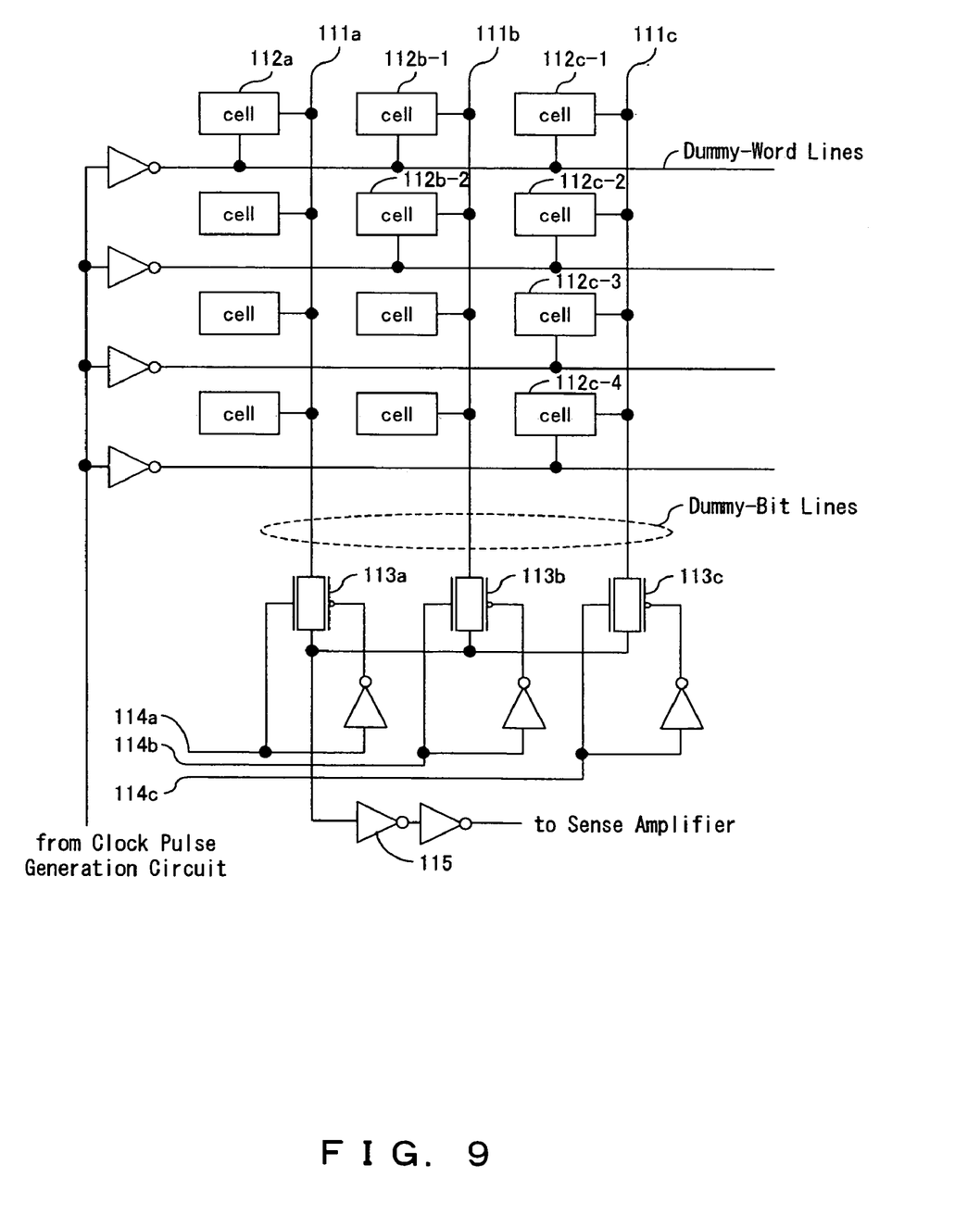
FIG. 9 shows an example configuration of a third embodiment of a self-timing circuit for a semiconductor memory apparatus according to the present embodiment.

FIG. 9 shows an example configuration of a third embodiment of a self-timing circuit for a semiconductor memory apparatus according to the present embodiment.

The self-timing circuit of the third embodiment comprises a plurality of dummy bit-lines each of which is connected by charge extraction dummy cells in the numbers of 1, 2, 4, et cetera, i.e., in the n-th power of 2. And, by selecting one line or a plurality of the lines, a more minute adjustment of delay is enabled as compared to the first and second embodiments given the same number of dummy bit-lines being comprised.

The configuration shown by FIG. 9 comprises three dummy bit-lines 111 consisting of three dummy bit-lines 111a, 111b and 111c connected with one, two and four charge extraction dummy cells, respectively, enabling seven steps (i.e., $2^3-1$) of switching the magnitude of delay corresponding to the position of a read-out memory cell.

In FIG. 9, when a memory array is divided into seven blocks, i.e., 1, 2, . . . , and 7, in the order of longer distances from the sense amplifier, only one column switch 113a is turned on by the selection signal lines 114a, 114b and 114c, and only a dummy bit-line 111a is selected to connect with an inverter 115 for reading data out of a memory cell located in the block 1, while only a column switch 113a is turned on and only a dummy bit-line 111b is selected to connect for the block 2.

Then, the column switches 113a and 113b are turned on and the dummy bit-lines 111a and 111b are selected to connect to the inverter 115 for the block 3. Likewise, the dummy bit-line 111c for the block 4, the dummy bit-lines 111a and 111c for the block 5, the dummy bit-lines 111b and 111c for the block 6, and the dummy bit-lines 111a, 111b and 111c for the block 7, in the shortest distance to the sense amplifier, are connected to the inverter 115, respectively, for these blocks.

This configuration enables a more minute control of delay by using the same number of dummy bit-lines, or a reduced number of dummy bit-lines for the same performance as compared to the self-timing circuits in the first and second embodiments.

As described above, in the semiconductor memory apparatus according to the present embodiment, a dynamic selection of the dummy bit-lines corresponding to the location of the memory cell which a data is being read out of enables amore precise simulation of signal delays as compared to a conventional semiconductor memory apparatus. This in turn enables a generation of activation signal for the sense amplifier at a more appropriate timing.

Also, by using the same type of switches as used in the actual reading out of memory for simulating the signal delays in the layout level, an error caused by differences in electrical characteristics can be eliminated.

Note that the memory cell blocks are evenly divided in the selection of dummy bit-lines in the above descriptions, but each block may be unevenly divided.

Also note that the semiconductor memory apparatus according to the present embodiment is not limited to SRAM but applicable to all semiconductor memory apparatuses comprising a sense amplifier, which is an amplifier for reading out of memory cells, such as DRAM, ROM, EPROM, FRRAM, et cetera.

What is claimed is:

1. A semiconductor memory apparatus, comprising:
   a cell array comprising a plurality of memory cells;
   a sense amplifier; and
   a self-timing unit comprising a plurality of dummy bit-lines, selecting said dummy bit-line based on a position of said memory cell of which a data is read out and generating an activation signal for controlling an activation timing of the sense amplifier at a time of reading data.

2. The semiconductor memory apparatus according to claim 1, wherein
   said self-timing unit selects said dummy bit-line based on a distance between said data read-out memory cell and said sense amplifier.

3. The semiconductor memory apparatus according to claim 2, wherein
   each of said plurality of dummy bit-lines is connected with a respectively different number of charge extraction dummy cell; and said self-timing unit selects one dummy bit-line connected with a small number of said charge extraction dummy cell when the distance between said data read-out memory cell and said sense amplifier is long, while selects one dummy bit-line connected with a large number of said charge extraction dummy cell when the distance between said data read-out memory cell and said sense amplifier is short.

4. The semiconductor memory apparatus according to claim 1, wherein
   each of said plurality of dummy bit-lines is connected with a same number of charge extraction dummy cell; and said self-timing unit changes a number of said dummy bit-lines to be selected based on a position of said data read-out memory cell.

5. The semiconductor memory apparatus according to claim 4, wherein
   said self-timing unit selects a small number of said dummy bit-line when a distance between said data read-out memory cell and said sense amplifier is long, while selects a large number of said dummy bit-lines when the distance between said data read-out memory cell and said sense amplifier is short.

6. The semiconductor memory apparatus according to claim 1, wherein
   each of said plurality of dummy bit-lines is connected with a respectively different number of charge extraction dummy cell; and said self-timing unit selects one or a plurality from among said plurality of dummy bit-lines based on a location of where said data is read out of.

7. The semiconductor memory apparatus according to claim 6, wherein
   said self-timing unit selects said dummy bit-line so that a number of said charge extraction dummy cell connected with the selected dummy bit-lines is small when a distance between said data read-out memory cell and said sense amplifier is long, and that the number of said charge extraction dummy cell connected with the selected dummy bit-line is large when the distance between said data read-out memory cell and said sense amplifier is short.

8. The semiconductor memory apparatus according to claim 1, wherein
   said self-timing unit comprises a selection unit selecting said dummy bit-line based on a decoder signal used for selecting a word-line.

9. The semiconductor memory apparatus according to claim 1, wherein
   said self-timing unit comprises a selection unit selecting said dummy bit-line based on a value of an address signal line.

10. The semiconductor memory apparatus according to claim 9, wherein
    said selection unit selects said dummy bit-line based on a value of an address signal line of the highest-order address.

11. The semiconductor memory apparatus according to claim 1, wherein
    said self-timing unit comprises a switch selecting said dummy bit-line, that is the same as a column switch used for the path for reading data out of said memory cell in the layout level.

12. The semiconductor memory apparatus in claim 1, wherein
said self-timing unit comprises an amplifier amplifying a signal on said selected dummy bit-line which is the same as said sense amplifier in the layout level.

13. A generation method for an activation signal controlling an activation timing of a sense amplifier amplifying a signal read out of a memory cell in a semiconductor memory apparatus, comprising a plurality of dummy bit-lines;

selecting said dummy bit-line from among said plurality of dummy bit-lines based on a position of said data read-out memory cell at a time of reading data; and generating said activation signal based on a signal of said selected dummy bit-line.

* * * * *